US006801036B2

United States Patent
Meyer

(10) Patent No.: US 6,801,036 B2
(45) Date of Patent: Oct. 5, 2004

(54) METHOD, MAGNETIC RESONANCE SYSTEM, AND COMPUTER PROGRAM FOR REGISTERING MAGNETIC RESONANCE SIGNALS OF A SUBJECT IN A RECONSTRUCTION REGION AND IN TWO INDEPENDENTLY SELECTABLE SUPPLEMENTAL REGIONS ADJOINING THE RECONSTRUCTION REGION IN THE PHASE-CODING DIRECTION

(75) Inventor: Heiko Meyer, Dormitz (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/318,937

(22) Filed: Dec. 13, 2002

(65) Prior Publication Data
US 2003/0114746 A1 Jun. 19, 2003

(30) Foreign Application Priority Data
Dec. 17, 2001 (DE) .......................................... 101 61 925

(51) Int. Cl.$^7$ ................................................. G01V 3/00
(52) U.S. Cl. ..................................................... 324/309
(58) Field of Search ................................ 324/307, 309, 324/311, 318, 322, 300, 312; 600/410, 422

(56) References Cited
U.S. PATENT DOCUMENTS

| 5,055,789 A | * | 10/1991 | Kondo et al. ................ 324/309 |
| 5,166,875 A | * | 11/1992 | Machida ...................... 600/410 |
| 5,544,653 A | * | 8/1996 | Takahashi et al. ........... 600/410 |
| 5,713,358 A | * | 2/1998 | Mistretta et al. ............. 600/420 |
| 5,786,693 A | * | 7/1998 | Gullapalli et al. ........... 324/309 |
| 5,810,728 A | * | 9/1998 | Kuhn ........................... 600/410 |
| 5,881,728 A | * | 3/1999 | Mistretta et al. ............. 600/420 |
| 6,147,493 A | * | 11/2000 | Miyoshi ....................... 324/312 |
| 6,218,838 B1 | * | 4/2001 | McGinley et al. ........... 324/320 |
| 6,326,789 B1 | * | 12/2001 | Yoshida et al. .............. 324/318 |
| 6,448,771 B1 | * | 9/2002 | Harvey et al. ............... 324/307 |
| 6,492,811 B1 | * | 12/2002 | Foxall ......................... 324/309 |
| 6,597,173 B1 | * | 7/2003 | Bernstein ..................... 324/318 |
| 6,600,317 B1 | * | 7/2003 | Kumai et al. ................ 324/307 |
| 6,671,536 B2 | * | 12/2003 | Mistretta ..................... 600/410 |

* cited by examiner

Primary Examiner—Christopher W. Fulton
Assistant Examiner—Dixomara Vargas
(74) Attorney, Agent, or Firm—Schiff Hardin LLP

(57) ABSTRACT

In a method and magnetic resonance system for registering magnetic resonance signals of a subject and reconstructing an image on the basis of the registered magnetic resonance signals, an operator provides a control device of the magnetic resonance system with a reconstruction region in a phase-coding direction within which the image should be reconstructed on the basis of the magnetic resonance signals to be registered. The control device effects the registration of the magnetic resonance signals in the phase-coding direction beyond the reconstruction region as well in two independently selectable supplemental regions that are disposed at both sides of the reconstruction region in the phase-coding direction and which immediately adjoin said reconstruction region.

5 Claims, 2 Drawing Sheets

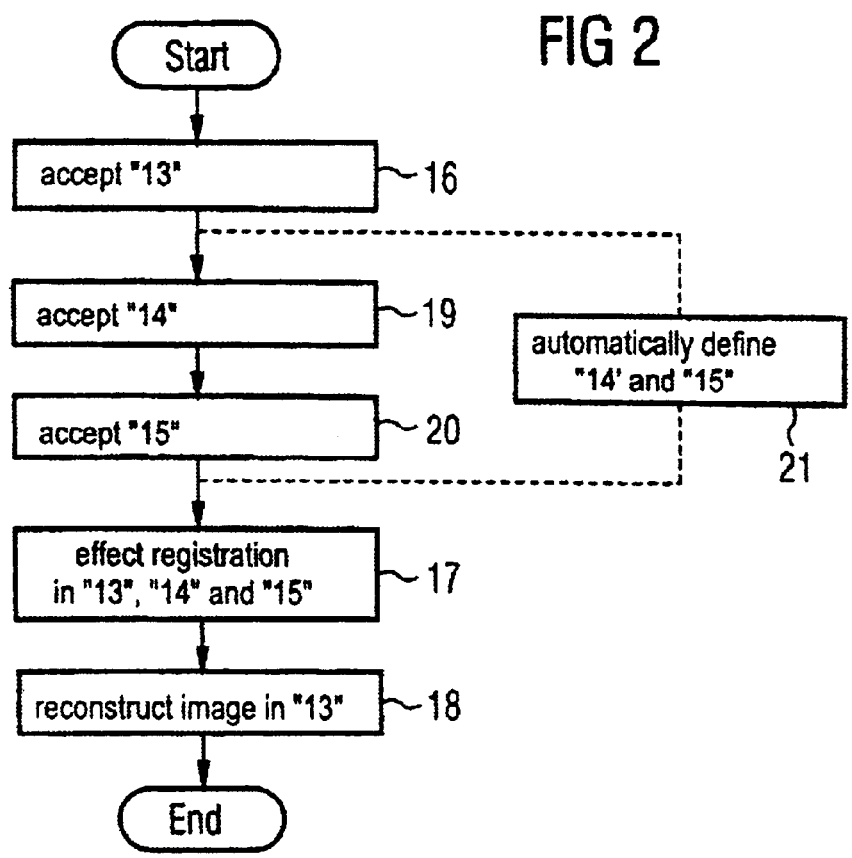
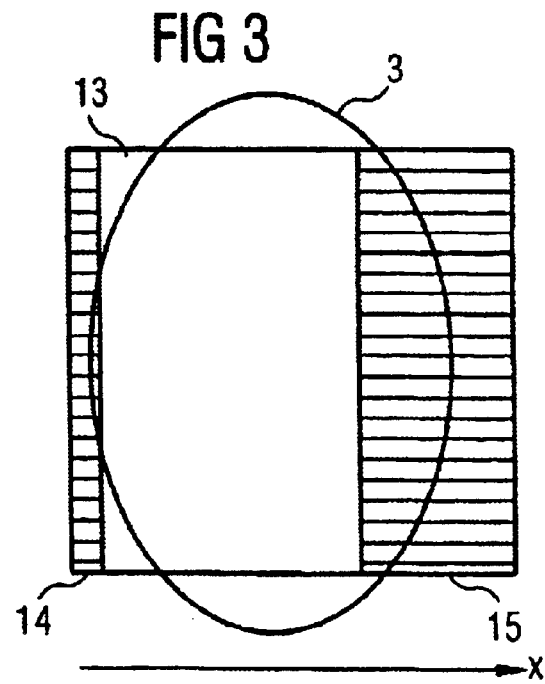

METHOD, MAGNETIC RESONANCE SYSTEM, AND COMPUTER PROGRAM FOR REGISTERING MAGNETIC RESONANCE SIGNALS OF A SUBJECT IN A RECONSTRUCTION REGION AND IN TWO INDEPENDENTLY SELECTABLE SUPPLEMENTAL REGIONS ADJOINING THE RECONSTRUCTION REGION IN THE PHASE-CODING DIRECTION

BACKGROUND OF THE INVENTION

1. Field of the Invention

The present invention is directed to a method and magnetic resonance system for registering magnetic resonance signals of a subject and reconstructing an image on the basis of the registered magnetic resonance signals.

2. Description of the Prior Art

Methods of the above type are known wherein an operator provides a control device with an input (entry) for the magnetic resonance system which designates a reconstruction region in a phase-coding direction within which the image should be reconstructed on the basis of the magnetic resonance signals to be registered, and wherein the control device effects the registration of the magnetic resonance signals in the phase-coding direction in the reconstruction region and beyond the reconstruction region as well in two supplemental regions that are disposed at both sides of the reconstruction region in the phase-coding direction and which immediately adjoin said reconstruction region.

The spatial resolution or coding in magnetic resonance tomography usually ensues in three steps.

When a magnetic resonance excitation signal is transmitted, first, a gradient field is superimposed on a uniform basic magnetic field in an excitation direction. The magnetic resonance signal therefore only excites elements to magnetic resonance that are disposed in a plane perpendicular to the excitation direction. The overall informational signal that is received later arises from these excited elements.

Upon reception of the magnetic resonance signals, a gradient field is likewise superimposed on the basic magnetic field. This gradient field, however, is oriented in a reception direction that differs from the excitation direction. Generally, the reception direction is perpendicular to the excitation direction. Due to the superimposition of this gradient field, the excited spins oscillate with a frequency that is dependent on the position of the excited spins within the plane excited by the reception gradient field. A further resolution in an axial direction onto a single axis is thus possible by means a later frequency analysis of the received magnetic resonance signal.

In order to also be able to distinguish individual points (volume elements, voxels) from one another within the magnetic resonance signals thus obtained, a short-duration gradient pulse is superimposed on the basic magnetic field between the emission of the magnetic resonance excitation signal and the reception of the magnetic resonance signal. This pulse is superimposed in a further direction that is linearly independent of, and usually perpendicaular to, the excitation direction and the reception direction. The various locations in this direction, which is usually referred to as the phase-coding direction, differ on the basis of the phase of the spins. The number of voxels that can be resolved in phase-coding direction thereby corresponds to the number of magnetic resonance signals registered with the various phase codings (referred to as raw data rows). Due to the fact that a phase coding can be exactly defined to a maximum of $2\pi$ (360°), the maximum phase coding in the phase-coding direction therefore is only allowed to be 360°.

Often, only a part of the acquirable measurement volume is of significance in phase-coding direction. For example, a viewer may be interested only in the left pulmonary wing of a patient. It is therefore known to provide the control device, as input thereto, with the reconstruction region of interest within which the image should be reconstructed.

A number of versions for the registration of the magnetic resonance signals are known.

First, there is the possibility of registering magnetic resonance signals from the entire measurement region that can be covered in the phase-coding direction. This, however, requires the registration of many raw data rows. The patient thus must spend a relatively long time in the magnetic resonance tomography apparatus, which is often considered extremely unpleasant by patients. Moreover, very large datasets, which must be processed, arise given this procedure.

Of course, it would be possible to register a lower number of raw data rows of the total measurement region, however, a low resolution that is often inadequate would then occur.

It has also been proposed to register raw data rows only from the reconstruction region and to reference the maximum phase of $2\pi$ to this region. In this case, however, it may occur that artifacts in the reconstructed image are generated due to subjects lying outside the reconstruction region but inside the covered measurement region. These artifacts cannot be avoided due to the fact that the phase offset can only be exactly defined within $2\pi$.

It is therefore usual for the control device to effect the registration of the magnetic resonance signals in the phase-coding direction beyond the reconstruction region as well in two supplemental regions that are disposed at both sides of the reconstruction region in the phase-coding direction and which immediately adjoin said reconstruction region. The two supplemental regions conventionally are of the same size and they are defined such that no elements that could elicit disturbing artifacts are outside the supplemental regions. In this case, the maximum phase coding of $2\pi$ refers to the boundaries of the supplemental regions. Generally, the operator provides (designates) these supplemental regions by an input (entry) into the control device. This procedure already assures a more or less efficient operation of the magnetic resonance system. In particular, a partial optimization of the number of required raw data rows already occurs in order to enable an adequately high-resolution reconstruction in the reconstruction region while simultaneously avoiding artifacts.

SUMMARY OF THE INVENTION

An object of the present invention is to provide a method and apparatus of the above type that represent an over conventional methods and systems.

This object is achieved in a magnetic resonance system and an operating method therefor of the above type wherein the supplemental regions can be selected independently of one another.

The size of the supplemental regions thus can be optimized independently of the position of the reconstruction region relative to the subject to be acquired. This is possible in conventional methods only in the case of an accidentally symmetrical position of the reconstruction region relative to the subject to be acquired.

As warranted, the supplemental regions can be defined automatically by the control device. This, for example, can ensue by means of a test scan in a single plane or a single line. However, it is simpler when the operator prescribes the supplemental regions for the control device.

DESCRIPTION OF THE DRAWINGS

FIG. 2 is a flow chart of the inventive method.

FIG. 3 schematically illustrates a reconstruction region and two supplemental regions in accordance with the inventive method.

DESCRIPTION OF THE PREFERRED EMBODIMENTS

Figure 1:
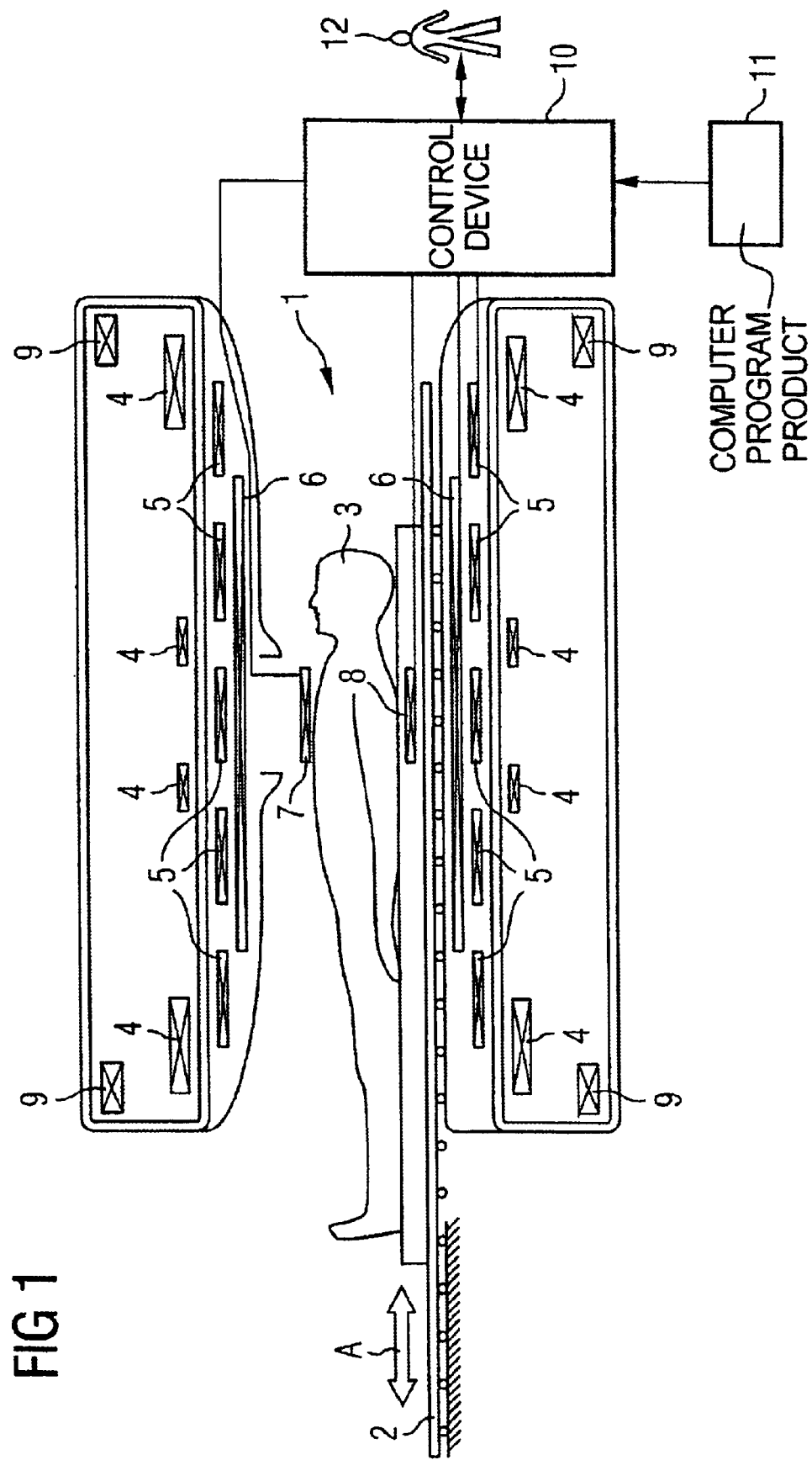
FIG. 1 is a sectional view of a magnetic resonance system for implementing the inventive method.

A shown in FIG. 1, a magnetic resonance system has an examination volume 1. A person 3 to be examined can be moved into the examination volume 1 with a patient bed 2. This is indicated with a double arrow A in FIG. 1.

In the examination volume 1, the person 3 is situated within a basic magnetic field that is generated by a basic field magnet 4. A basic current flows in the basic magnet 4 for this purpose. A shield current also flows in a shield magnet 9.

The magnetic resonance system also has a gradient magnet system 5 and a radio-frequency coil 6, and may also have local coils 7, 8 as warranted.

The gradient magnet system 5 as well as the radio-frequency coil 6 and the local coils 7, 8 (if present) are connected to a control device 10. The control device 10 processes a control program that is realized as a computer program product 11. The control device 10 controls the gradient magnet system 5 and the coils 6 through 8. The control device 10 also interactively accepts inputs from an operator 12 and interactively supplies outputs to the operator 12.

The basic operation of the magnetic resonance system controlled by the control device 10 is known. In particular, the control device 10—see FIGS. 2 and 3—accepts a reconstruction region 13 in a phase-coding direction x from the operator 12 in a step 16. On the basis of magnetic resonance signals to be registered, the control device 10 reconstructs a partial image of a subject of interest 3, for example the left pulmonary wing of the person 3, within the reconstruction region 13. As a result of the acceptance in step 16, the reconstruction region 13 is thus prescribed for the control device 10.

In a step 17 as is also known, the control device 10 effects the registration of the magnetic resonance signals (raw data rows) in the phase-coding direction x in the reconstruction region 13 and in two supplemental regions 14, 15 beyond the reconstruction region 13. As shown in FIG. 3, the supplemental regions 14, 14 are disposed at both sides of the reconstruction region 13 and are directly adjacent to the reconstruction region 13. The reconstruction of an image of the registered subject 3 in the reconstruction region 13 then ensues in a known way in a step 18.

Differing from this known manner of operation, in accordance with the inventive method, the operator 12 specifies the supplemental regions 14, 15 for the control device 10 independently of one another in steps 19 and 20. The supplemental regions 14 and 15 thus can be selected independently of one another by the operator 12. As a result, a minimization of the required number of registrations of raw data rows can be achieved without reducing the resolution in the phase-coding direction x that can be achieved in the reconstruction region 13.

As an alternative to the implementation of steps 19 and 20, it is also possible for the control device 10 to automatically defines the supplemental regions 14 and 15 in a step 21. This is indicated with broken lines in FIG. 2. In this case, the control device 10 makes the selection of the supplemental regions 14, 15 on its own.

Although modifications and changes may be suggested by those skilled in the art, it is the intention of the inventor to embody within the patent warranted hereon all changes and modifications as reasonably and properly come within the scope of his contribution to the art.

What is claimed is:

1. A method for operating a magnetic resonance system, having a phase-coding gradient coil, a radio-frequency coil for registering magnetic resonance signals of a subject which are phase-coded in a phase-coding direction by a phase-coding gradient generated by said phase-coding gradient coil, and a control for reconstructing an image of said subject from the phase-coded magnetic resonance signals, comprising the steps of:

manually entering, into said control device, a designation of a reconstruction region of said subject in said phase-coding direction, within which said image of said subject is to be reconstructed from said phase-coded magnetic resonance signals;

by said control device, controlling registration of said magnetic resonance signals in said phase-coding direction in said reconstruction region and beyond said reconstruction region, as well as in two supplemental regions disposed at both sides of said reconstruction region in said phase-coding direction and immediately adjoining said reconstruction region; and selecting said supplemental regions independently of each other.

2. A method as claimed in claim 1 comprising automatically determining said supplemental regions in said control device.

3. A method as claimed in claim 1 comprising manually entering a designation of said supplemental regions into said control device.

4. A computer program product loadable into a control unit of a magnetic resonance system having a phase-coding gradient coil, for programming said control unit, for operating said magnetic resonance system for registering magnetic resonance signals of a subject which are phase-coded in a phase coding direction by a phase-coding gradient generated by said phase-coding gradient coil, from which an image of said subject is reconstructed, and to allow manually entry into said control device of a designation of a reconstruction region of said subject in said phase-coding direction, within which said image of said subject is to be reconstructed from said phase-coded magnetic resonance signals, and for, by said control device, controlling registration of said magnetic resonance signals in said phase-coding direction in said reconstruction region and in two supplemental regions disposed at both sides of said reconstruction region in said phase-coding direction and immediately adjoining said reconstruction region, and to allow selection of said supplemental regions independently of each other.

5. A magnetic resonance system comprising:

a magnetic resonance scanner including a basic field magnet which generates a basic magnetic field in said scanner, a gradient coil system including phase-coding gradient coil for superimposing a phase-coding gradient in a phase-coding direction on said basic magnetic field, and a radio-frequency system for exciting nuclear spins in a subject in said scanner and for receiving magnetic resonance signals arising from said subject;

a control device having a user interface allowing manual entry of a reconstruction region in said phase-coding direction for said phase-coding gradient, within which an image of said subject is to reconstructed from magnetic resonance signals that are phase-coded by said phase-coding gradient in said phase-coding direction, said control device operating said magnetic resonance scanner to register said magnetic resonance signals in said phase-coding direction in said reconstruction region and in two supplemental regions disposed at both sides of said reconstruction region in said phase-coding direction and which immediately adjoin said reconstruction region, said control device allowing selection of said supplemental regions independently of each other; and a computer for reconstructing said image of said subject from said phase-coded magnetic resonance signals.

* * * * *